United States Patent [19]

Egawa et al.

[11] Patent Number: 5,134,623
[45] Date of Patent: Jul. 28, 1992

[54] APPARATUS FOR CONTROLLING INTENSITY OF LASER BEAM EMITTED FROM SEMICONDUCTOR LASER UNIT

[75] Inventors: Jiro Egawa, Yokosuka; Naoaki Ide, Yokohama, both of Japan

[73] Assignee: Kabushiki Kaisha Toshiba, Kawasaki, Japan

[21] Appl. No.: 634,456

[22] Filed: Dec. 27, 1990

[30] Foreign Application Priority Data

Dec. 28, 1989 [JP] Japan .................................. 1-344407

[51] Int. Cl.$^5$ .............................................. H01S 3/10
[52] U.S. Cl. .......................................... 372/31; 372/9; 372/26; 372/38
[58] Field of Search ...................... 372/31, 26, 38, 44, 372/9

[56] References Cited

U.S. PATENT DOCUMENTS

| | | | |
|---|---|---|---|
| 4,802,179 | 1/1989 | Negishi | 372/38 |
| 4,821,273 | 4/1989 | Hori | 372/31 |
| 4,907,236 | 3/1990 | Shimada | 372/31 |
| 4,912,714 | 3/1990 | Hatanaka et al. | 372/31 |
| 4,916,706 | 4/1990 | Ohashi | 372/31 |

Primary Examiner—Georgia Y. Epps
Attorney, Agent, or Firm—Foley & Lardner

[57] ABSTRACT

In an apparatus for adjusting the intensity of a light beam, the light beam from a semiconductor laser is deflected to scan a photosensitive drum and is detected to generated a positional signal by photodetector outside of the drum. The intensity of the light beam is also detected by a monitor detector and compared with a predetermined value. The comparison result is latched in a first latch circuit in accordance with the positional signal and a driving data is determined in accordance with the latched comparison data. The driving data is also latched in a second latch circuit and the semiconductor laser is controlled depending on the latched driving data.

10 Claims, 7 Drawing Sheets

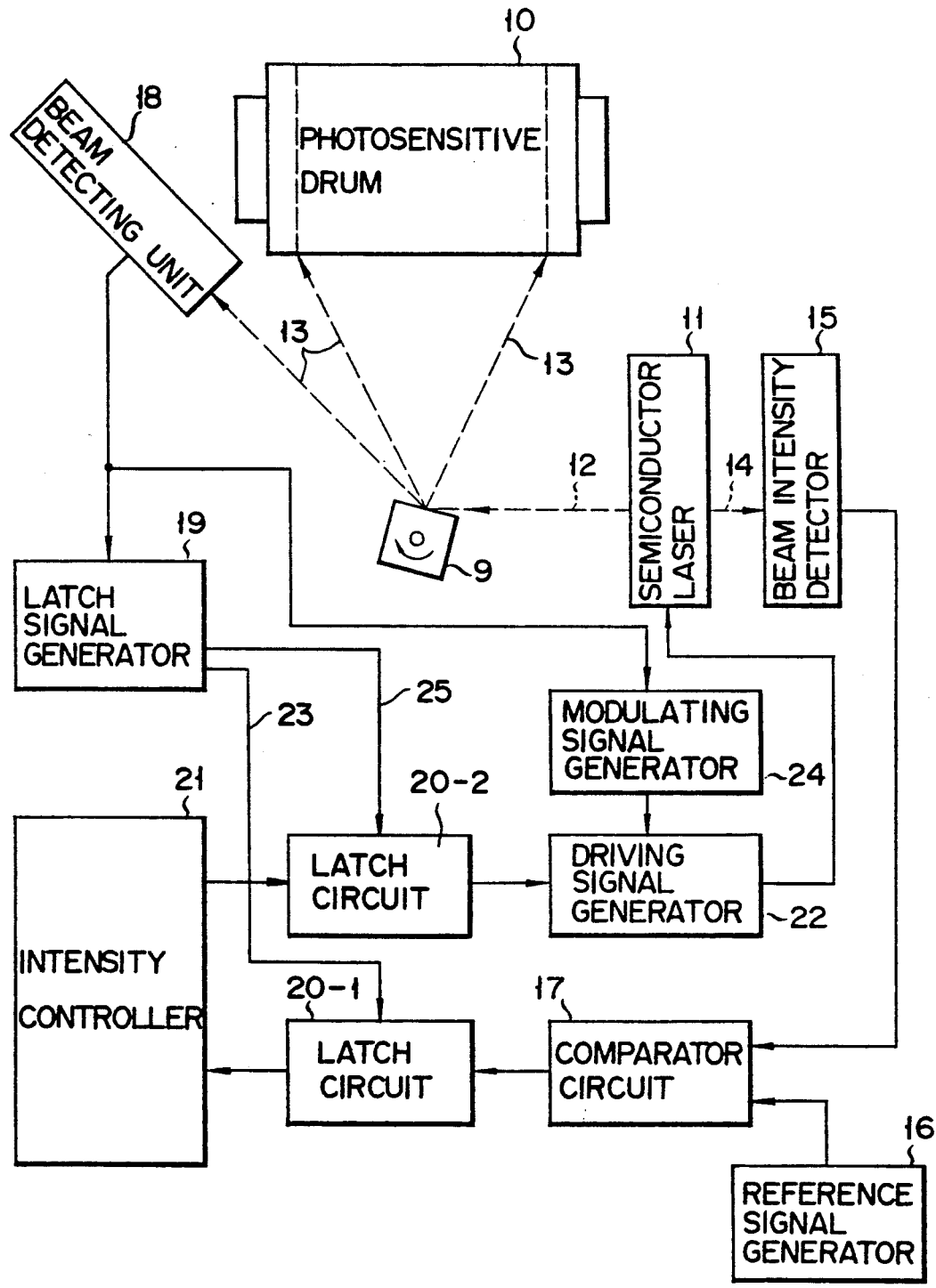
F I G. 1

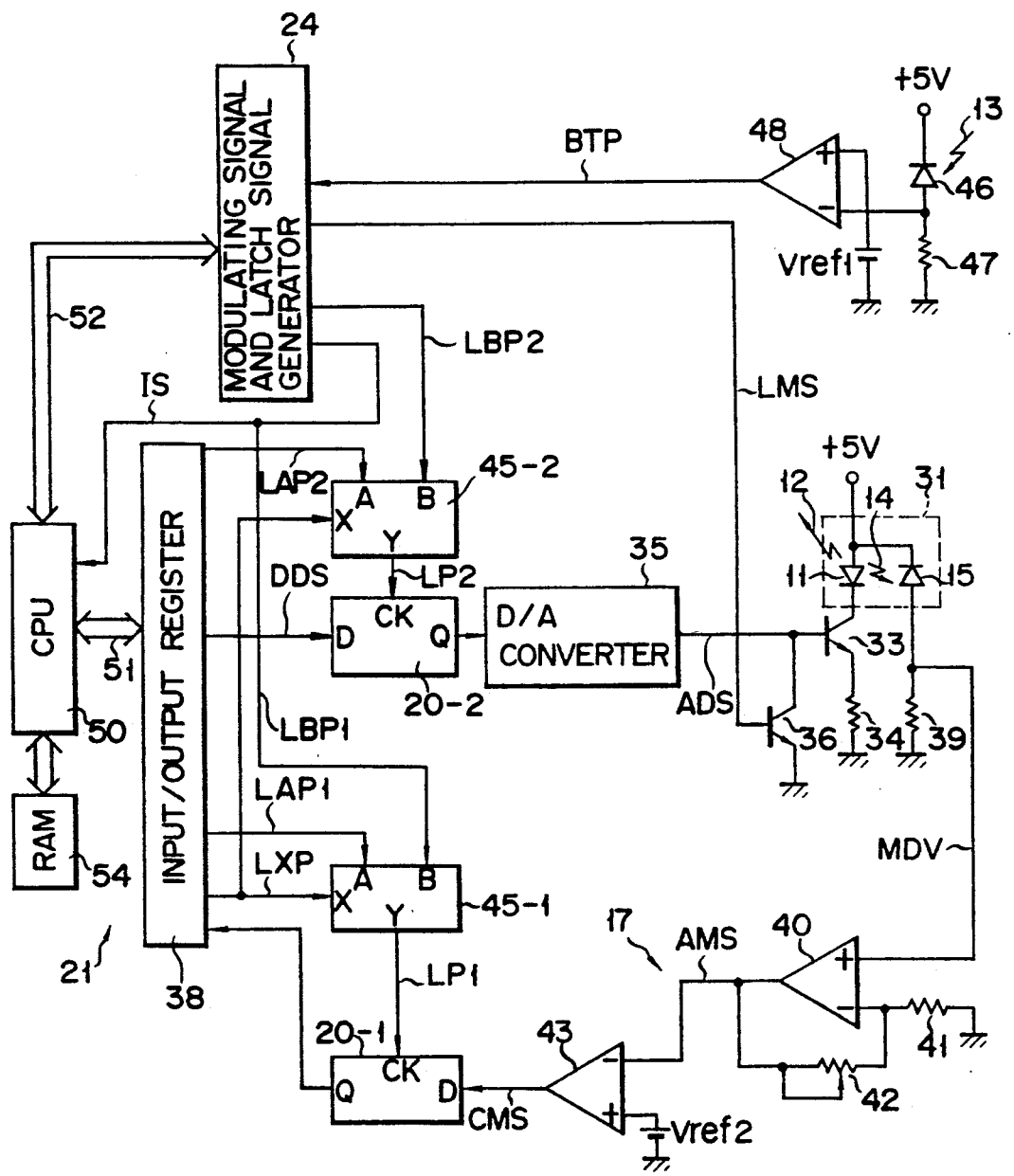
F I G. 2

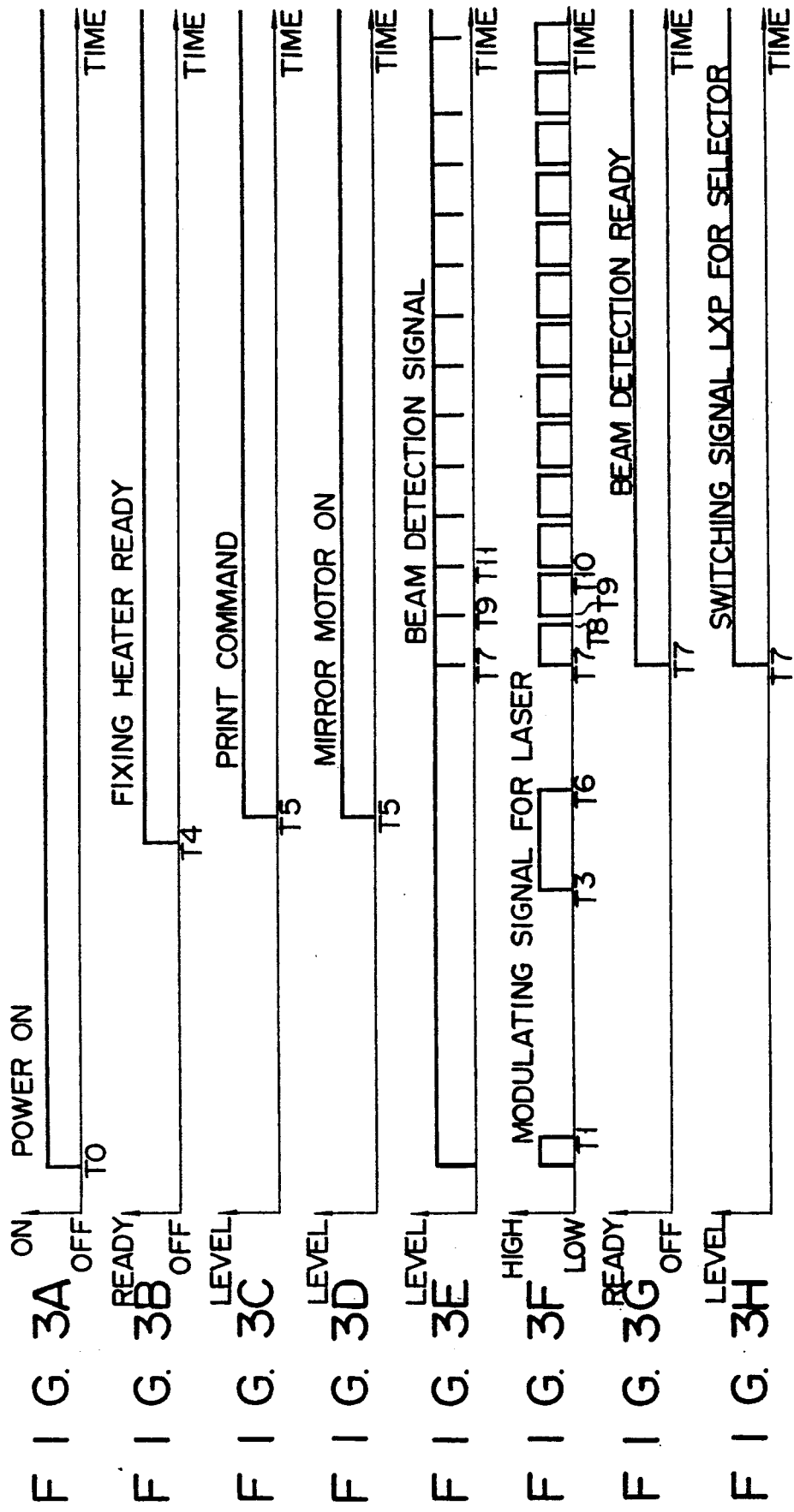

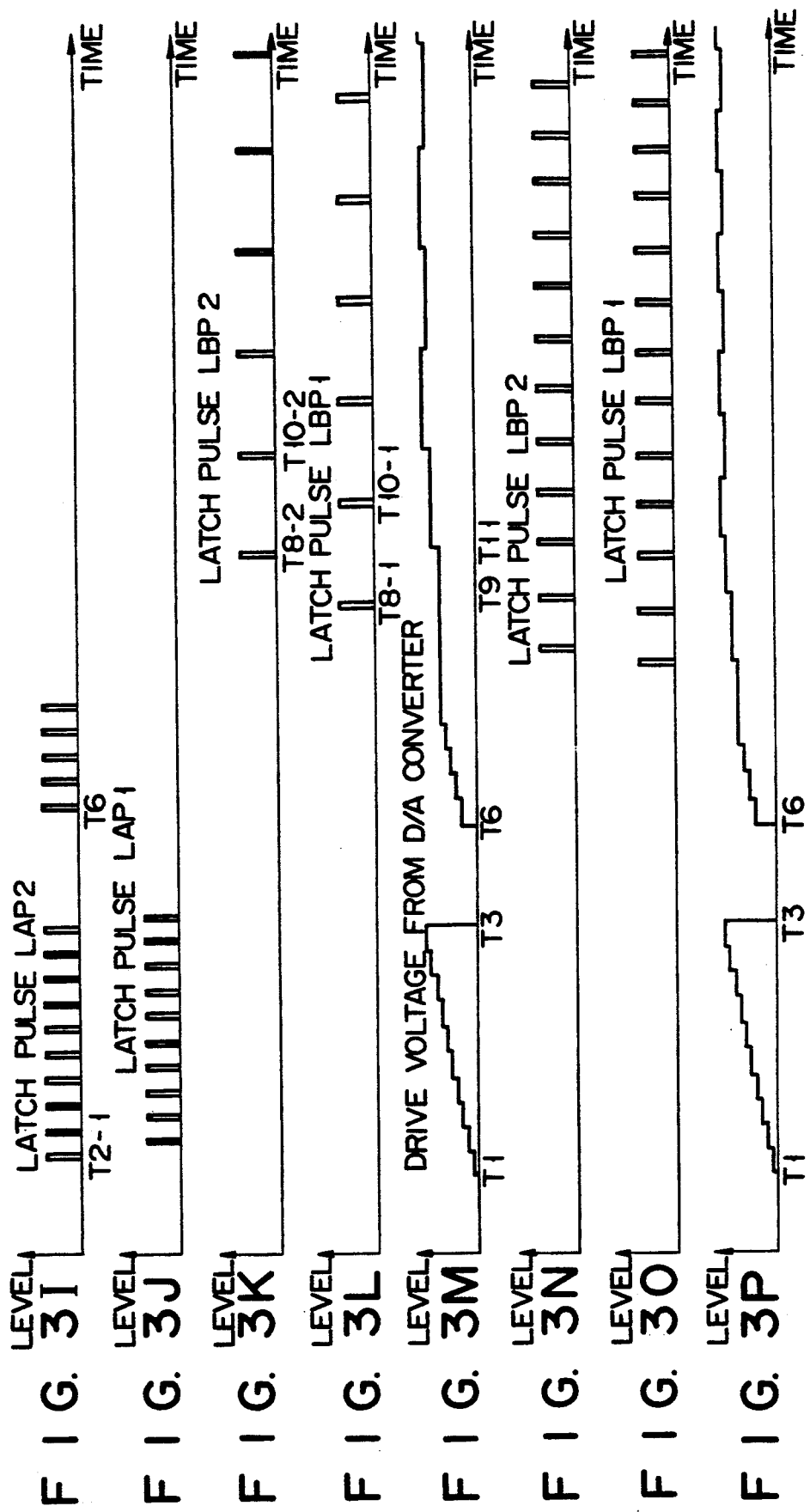

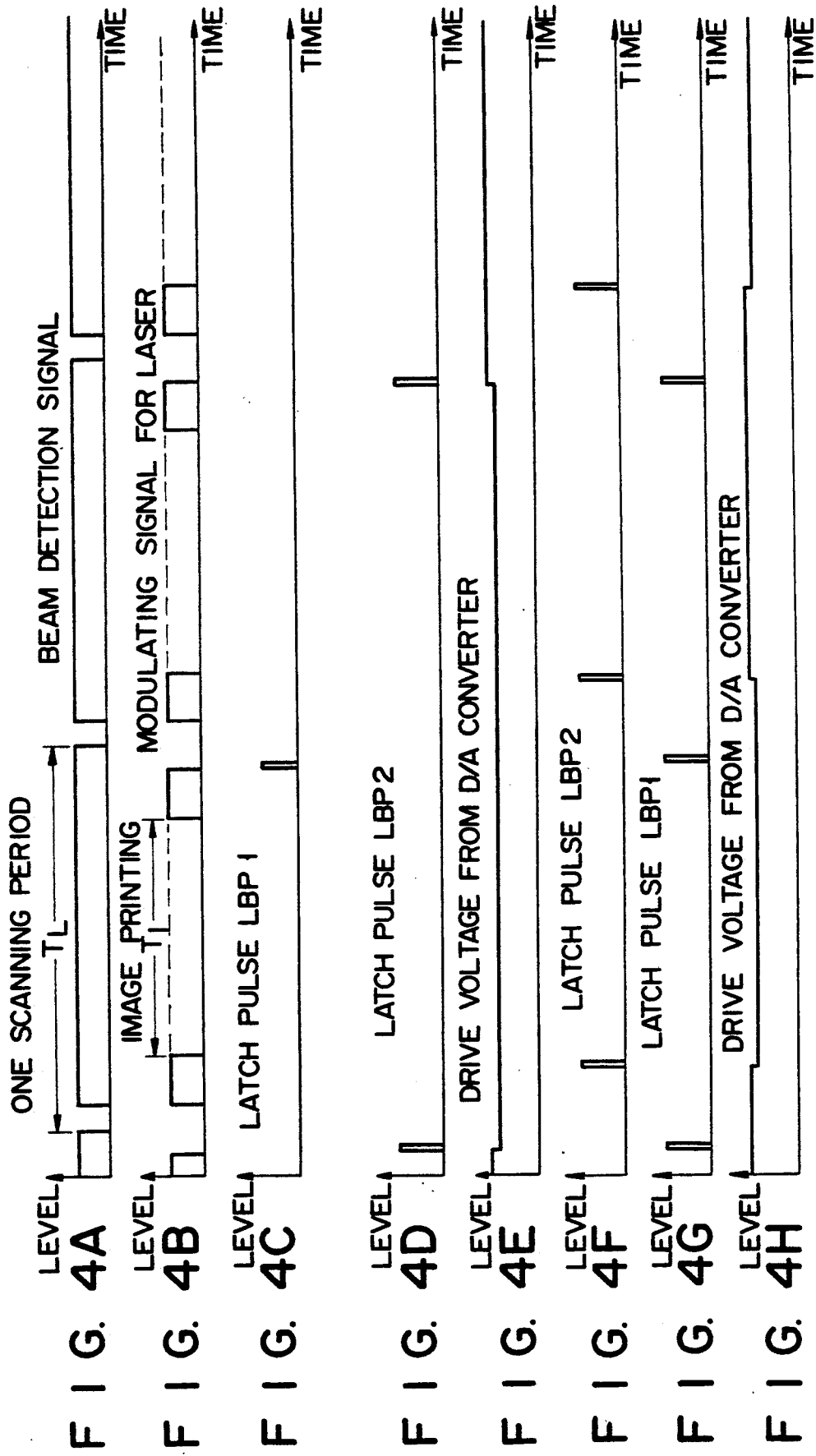

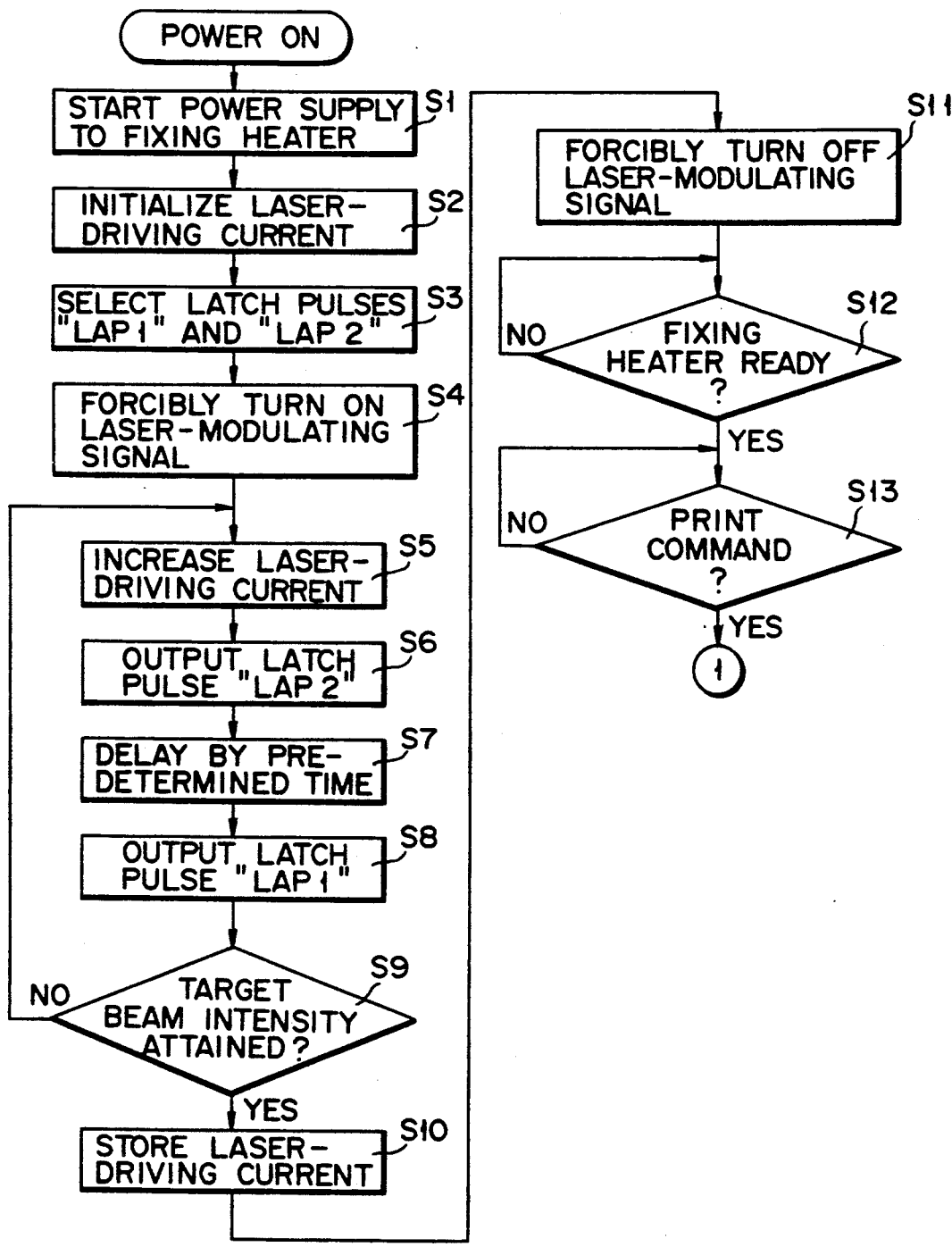
F I G. 5A

APPARATUS FOR CONTROLLING INTENSITY OF LASER BEAM EMITTED FROM SEMICONDUCTOR LASER UNIT

BACKGROUND OF THE INVENTION

1. Field of the Invention

The present invention relates to an apparatus which controls the intensity of a laser beam emitted from a laser unit, and more particularly to a beam intensity-controlling apparatus adapted for use with a semiconductor laser unit incorporated in an image-forming apparatus, such as a laser printer or a digital copying machine.

2. Description of the Related Art

In recent years, an electrophotographic laser printer has been developed, which scans a photosensitive surface with the laser beam emitted from a laser unit for the purpose of exposure and which prints images and/or characters by utilization of an electrophotographic process. In this type of laser printer, the laser unit is constituted by a semiconductor laser unit. In general, the beam intensity of the laser beam emitted from the semiconductor laser unit has to be stabilized by a control device since the beam intensity is likely to vary in accordance with temperature.

There are various types of known control systems which can control the intensity of the laser beam emitted from the semiconductor laser unit. Of the known control systems, the control system which employs a general-purpose microcomputer or microprocessor incorporating an A/D converter is considered a low-cost type. In this type of control system, the semiconductor laser is energized to emit a laser beam and a detector detects the beam intensity of the laser beam during the interval between the image-recording operation performed with respect to a given page and the image-recording operation performed with respect to the succeeding page, and the detected beam intensity is supplied to the A/D converter, for reading. The beam intensity read by the A/D converter is compared with a reference signal by the microcomputer and its peripheral circuits, and the current used for the driving of the semiconductor laser unit is controlled on the basis of the comparison. In this manner, the intensity of the laser beam emitted from the semiconductor laser unit is stabilized.

According to the conventional control system mentioned above, the intensity of the laser beam emitted from the semiconductor laser unit is stabilized, by causing the semiconductor laser unit to emit a laser beam in the interval which is between the image-recording operations performed with respect to two successive pages, i.e., in the interval in which the image-recording operation is not performed. If this control system is used in a certain type of image-forming apparatus (e.g., a laser printer or a digital copying machine to which a reversal development system is applied), the laser beam emitted in the interval between the image-recording operations may fall on a recording region. If this occurs, the image on the recording region is developed with toner, so that the toner is used incorrectly.

According to another type of control system which may solve the above problem, the intensity of a laser beam emitted from the semiconductor laser unit is stabilized, with the semiconductor laser unit being energized in the region other than the recording region. According to this control system, however, the time during which the semiconductor laser unit is energized is comparatively short, and the A/D converter incorporated in the general-purpose microcomputer requires a long time for reliably reading the detected beam intensity of the semiconductor laser unit. This being so, it is necessary to employ a high-speed A/D converter, i.e., a costly A/D converter. It is also necessary to employ a high-speed microcomputer since high-speed processing is required from the reading of the detected beam intensity to the determination of the driving current supplied to the semiconductor laser unit.

In the case where the semiconductor laser unit and the beam intensity controller are located away from each other, the analog line between the beam intensity detector (by which the beam intensity of the semiconductor laser unit is detected) and the A/D converter is inevitably long. Consequently, the signal transmitted between the beam intensity detector and the A/D converter is likely to include noise.

In the case of a high-speed laser printer or digital copying machine, the time needed before the start of the first printing or copying operation is short. The higher the operation speed of the laser printer or digital copying machine is, the shorter will be the time required before the start of the first printing or copying operation. If, however, the time needed for attainment of the target beam intensity is long, it is not possible to make the most of the high-speed operation of the laser printer or digital copying machine.

SUMMARY OF THE INVENTION

Accordingly, an object of the present invention is to provide a beam intensity controller capable of controlling the intensity of a laser beam emitted from a semiconductor laser unit, in a stable manner and with high responsiveness.

Another object of the present invention is to provide an apparatus which can reliably control the intensity of a laser beam emitted from a semiconductor laser unit without wasting toner, which eliminates the need to employ a high-speed A/D converter or microcomputer even if it is applied to a high-speed laser printer or a high-speed digital copying machine, and which prevents inclusion of noise even if a beam intensity-detecting means and a beam intensity controller are arranged away from each other.

According to the present invention, there is provided an apparatus which controls the intensity of a light beam and which comprises:

means for generating the light beam;

means for detecting the intensity of the light beam generated from the generating means;

means for comparing the intensity of light beam detected by the detecting means with a predetermined reference value;

first latch means for latching the comparison result from the comparing means;

means for determining a driving data used for driving the light beam-generating means, in accordance with the comparison result latched by the first latch means;

second latch means for latching the driving data determined by the determining means; and means for driving the light beam-generating means in accordance with the driving data latched in the second latch means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a block circuit diagram of an apparatus according to one embodiment of the present invention, which apparatus controls the intensity of the laser beam emitted from a semiconductor laser unit;

FIG. 2 is a block circuit diagram showing details of part of the apparatus shown in FIG. 1;

FIGS. 3A-3N are timing charts for explaining the operation of the apparatus shown in FIG. 2;

FIGS. 3N-3P are timing charts for explaining the operation of an apparatus according to a modified embodiment of the invention;

FIGS. 4A, 4B, 4C, 4D and 4E are partially-enlarged timing charts corresponding to those shown in FIGS. 3E, 3F, 3K, 3L and 3M respectively;

FIG. 4F, 4G and 4H are partially-enlarged timing charts corresponding to those in FIGS. 3N, 3O and 3P respectively; and FIGS. 5A and 5B are flowcharts for explaining the operation of the apparatus shown in FIG. 2.

DETAILED DESCRIPTION OF THE PREFERRED EMBODIMENTS

Figure 5B:
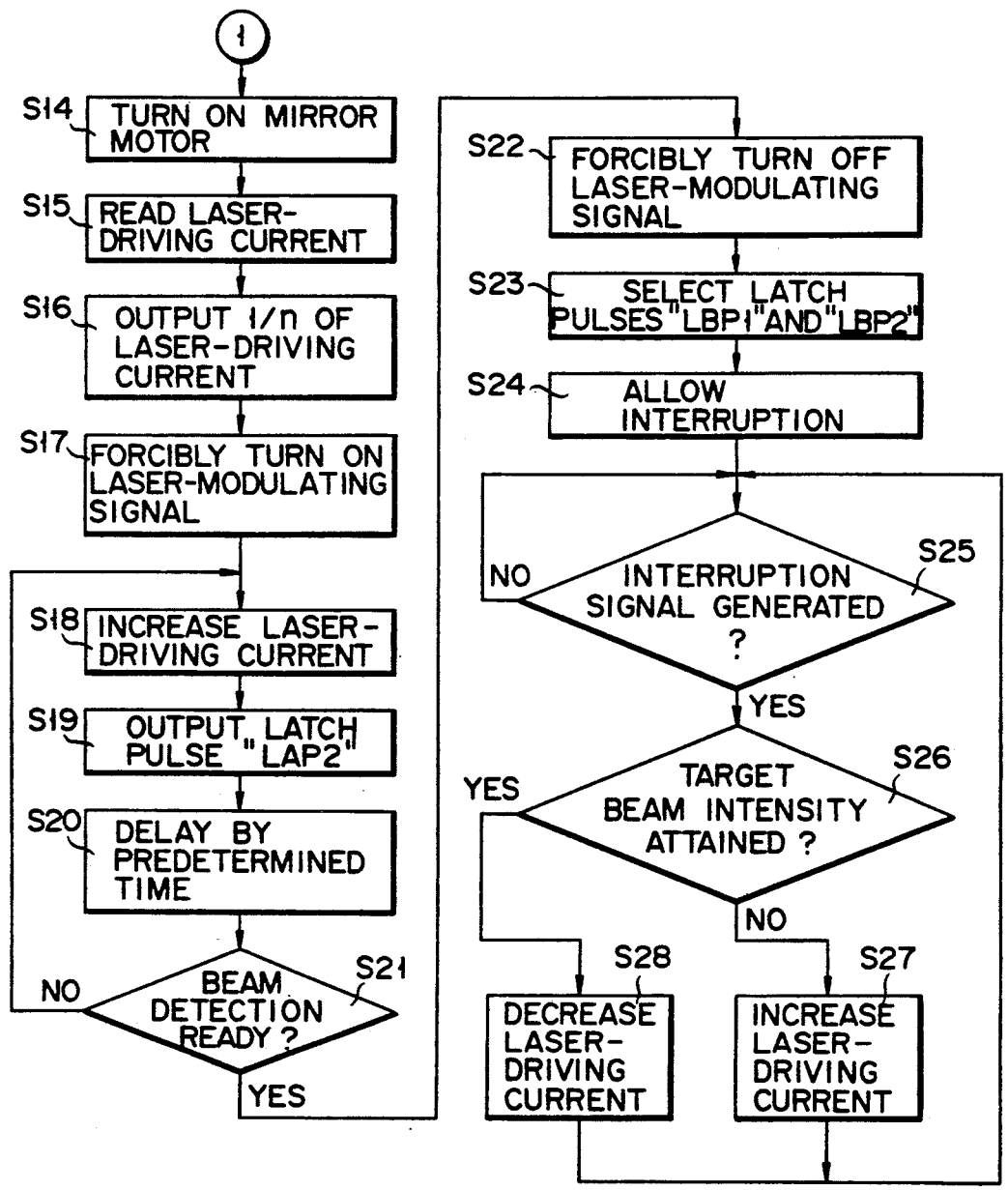

One embodiment of the present invention will now be described, with reference to the accompanying drawings.

FIG. 1 is a block circuit diagram of an apparatus according to one embodiment of the present invention, the apparatus being for controlling the intensity of the laser beam emitted from a semiconductor laser unit. In the apparatus shown in FIG. 1, the laser beam 12 emitted from a semiconductor laser 11 is directed to a polygonal mirror 9 and is then deflected toward a photosensitive drum 10. The photosensitive drum 10 is scanned with the deflected laser beam 13, so that an electrostatic latent image is formed on the photosensitive drum 10. When the laser beam 12 deflected by the polygonal mirror 9 is directed to the region which is outside the recording region of the photosensitive drum 10, a beam-detecting unit 18 detects the scanning point or position of the laser beam 13 and outputs a beam detection signal.

The semiconductor laser 11 is driven by a drive signal generator 22. This drive signal generator 22 receives a modulation signal from a modulating signal generator 24 in synchronism with the output of the beam detection signal. In response to the modulation signal, the drive signal generator 22 drives the semiconductor laser 11 by supplying a current thereto, such that image information is recorded on the predetermined region on the photosensitive drum 10 by use of the laser beam. The laser beam emitted from the semiconductor laser 11 is also directed to a beam intensity detector 15, as is indicated by reference numeral 14. This beam intensity detector 15 detects the beam intensity of the laser beam directed thereto and supplies a detection signal to a comparator circuit 17. The comparator circuit 17 compares the detection signal supplied thereto from the beam intensity detector 15 with a reference signal supplied thereto from a reference signal generator 16, and outputs a comparison signal. A latch signal generator 19, which is connected to the beam detecting unit 18, generates an input latch signal 23 and an output latch signal 25 in response to the beam detection signal output by the beam-detecting unit 18, i.e., in synchronism with the time at which the laser beam deflected by the polygonal mirror 9 has reached the region outside the recording region. A first latch circuit 20-1 is connected to the comparator circuit 17, and latches the comparison signal supplied thereto from the comparator circuit 17, in response to an input latch signal 23.

An intensity controller 21 determines the driving current to be supplied to the driving signal generator 22 in accordance with the comparison signal latched in the first latch circuit 20-1. The driving current determined by the intensity controller 21 is latched in a second latch circuit 20-2 in response to the output latch signal 25 generated from the latch signal generator 19. On the basis of the driving current latched in the second latch circuit 20-2, a driving signal generator 22 drives the semiconductor laser unit 11 and the laser beam emitted from the semiconductor laser unit 11 is controlled to have a substantially constant beam intensity.

FIG. 2 is a block circuit diagram illustrating a detailed structure of the intensity controller 21 shown in FIG. 1, along with its peripheral circuits. As is shown in FIG. 2, a semiconductor laser unit 31 is made up of a laser diode 11 and a photodiode 15. The laser diode 11 constitutes the semiconductor laser mentioned above, while the photodiode 15 constitutes a beam intensity detector which detects the intensity of a laser beam output from the laser diode 11, for monitoring. The laser diode 11 is driven with a constant current which is supplied from a constant-current circuit made up of a transistor 33 and a resistor 34. The output terminal of a D/A converter 35, which converts a digital driving signal DDS to an analog driving signal ADS, is connected to the base of transistor 33. The collector of transistor 36 is also connected to the base of transistor 33. With this circuit arrangement, the driving current flowing through the laser diode 11 varies in proportion to the output voltage ADS of the D/A converter 35.

Transistor 36 is repeatedly turned on or off in accordance with a laser-modulating signal LMS output from the modulating signal generator 24, so that the laser diode 11 is modulated and emits an intensity-modulated laser beam 12. In the circuit of this embodiment, the laser diode 11 is de-energized when the laser-modulating signal LMS is at the high level, and is energized and emits a laser beam when the laser-modulating signal LMS is at the low level. The digital driving signal DDS (a current signal) output from an input/output register 38 is latched in the second latch circuit 20-2 in response to an output latch signal LP2 supplied through a selector 45-2, and the latched digital driving signal DDS is converted into an analog voltage signal ADS by the D/A converter 35.

The selector 45-2 selects either an output latch pulse LAP2 or an output latch pulse LBP2, in accordance with a latch pulse-switching signal LXP supplied from the input/output register 38. The output latch pulse LAP2 is output from the input/output register 38 on the basis of the control program, while the output latch pulse LBP2 is output from the modulating signal generator 24. In the case of this embodiment, the selector 45-2 selects the output latch pulse LAP2 if the latch pulse-switching signal LXP is low in level, and selects the output latch pulse LBP2 if the latch pulse-selecting signal LXP is high in level.

A current flowing through the monitoring photodiode 15 varies in proportion to the intensity of the laser beam 14 generated by the laser diode 11. To convert the current flowing through the photodiode 15 into a voltage, a resistor 39 is connected between the photodiode 15 and the ground. A detection voltage MDV obtained by resistor 39 is supplied to the comparator circuit 17, which is made up of an operation amplifier 40, a resistor 41, a variable resistor 42, and a comparator 43. More specifically, the detection voltage MDV is supplied to the operation amplifier 40 of the amplifier circuit 17. This amplifier 40 constitutes a non-inversion type amplifier, by which the detection voltage MDV is amplified without being inverted. It should be noted that the variable resistor 42 is employed for the purpose of adjusting the amplification factor. The current flowing through the through the photodiode 15 may differ, depending upon the characteristic variation of the laser diode 31 so that the detection voltage MDV may differ. However, the amplified signal AMS from the operational amplifier 40 can be so corrected such that the amplified signal corresponding to the intensity of the laser beam emitted from the laser diode 11 by adequately determining the amplification factor, i.e., by adjusting the resistance of the variable resistor. An amplified signal AMS, produced from the operation amplifier 40, is supplied to the negative input terminal of the comparator 43, and is compared with a reference voltage Vref2 supplied to the positive input terminal of the comparator 43. The level of the reference voltage Vref2 is determined in accordance with the desirable target intensity of the laser beam emitted from the laser diode 11. If the level of the output AMS of the operation amplifier 40 is lower than that of the reference voltage Vref2, the output CMS of the comparator 43 becomes high in level, on the assumption that the laser beam has not yet attained the target beam intensity. If the level of the output AMS of the operation amplifier 40 exceeds the level of the reference voltage Vref2, the output of the comparator 43 becomes low in level, on the assumption that the intensity of the laser beam has exceeded the target beam intensity. A comparison signal CMS output from the comparator 43 is supplied to the latch circuit 20-1. The comparison signal CMS is latched in this latch circuit 20-1 in synchronism with an input latch pulse Lp1 which is supplied from a selector 45-1 and which has a different phase from that of the output latch pulse LP2. An output of this latch circuit 20-1 is supplied to the input/output register 38, and is then processed by a CPU 50 which is in charge of the entire control of the printer.

Like selector 45-2, selector 45-1 selects either an input latch pulse LAP1 or an input latch pulse LBP1, in accordance with a latch pulse-switching signal LXP supplied from the input/output register 38. The input latch pulse LAP1, having a phase different from that of the output latch pulse LAP2, is output from the input/output register 38 on the basis of the control program, while the input latch pulse LBP1, having a phase different from that of the output latch pulse LBP2, is output from the modulating signal generator 24. In the case of this embodiment, the selector 45-1 selects input latch pulse LAP1 if the latch pulse-switching signal LXP is low in level, and selects input latch pulse LBP1 if the latch pulse-selecting signal LXP is high in level.

The beam detecting unit 18 such as a pin diode 46 detects a scanning position or point which is scanned with the scanning laser beam 13. When the scanning laser beam 12 is incident on the pin diode 46, this pin diode 46 generates a current signal which is proportional to the intensity of the incident laser beam. The current signal is converted into a voltage signal by resistor 47. The voltage signal, thus obtained, is supplied to the negative terminal of a comparator 48, and is compared with a reference voltage Vref1 which is supplied to the positive terminal of the comparator 48. The result of this comparison is output as a negative pulse beam-detecting signal BTP, and is supplied to the modulating signal generator 24.

Upon receipt of the beam-detecting signal BTP, the modulating signal generator 24 changes the level of a beam-detection-ready signal BRS from low to high. (The beam-detection-ready signal BRS is supplied from the modulating signal generator 24 to the input/output register 38, to inform the input/output register 38 that the beam detection is ready.) The latch pulse-selecting signal LXP output from the input/output register 38 has a low level when the level of the beam-detection-ready signal BRS is low in level, and has a high level when the level of the beam-detection-ready signal BRS is high in level. When the beam-detecting signal BTP is output, the modulating signal generator 24 generates a forcible input latch pulse LBP1 on the assumption that the laser beam has reached the region outside the recording region. The input latch pulse LBP1 is supplied to the interruption terminal of the CPU 50 as an interruption signal IS. An internal bus 51 of the CPU 50 is connected to the input/output register 38, and bus 52 connects the CPU to the modulating signal generator 24.

The operation of the circuit shown in FIG. 2 will now be described, with reference to the timing charts shown in FIGS. 3A–3M and FIGS. 4A–4E and the flowcharts shown in FIGS. 5A and 5B.

Referring to FIG. 5A, when the power source is turned on at time T0 (FIG. 3A), a warming-up operation of the apparatus is started. In other words, the current supply to a fixing heater is started in step S1. The fixing heater becomes ready for fixing at time T4 (FIG. 3B), which is a predetermined time after time T0. After time T0, the laser-driving current output from the input/output register 38 is initialized in step S2. Next, in step S3, the selectors 45-1 and 45-2 select the input latch pulse LAP1 and output latch pulse LAP2 both coming from the register 38, in accordance with the latch pulse-selecting signal LXP (FIG. 3H) output from the input-/output register 38. As is shown in FIG. 3I and 3J, the supply of the input latch pulse Lp1 and output latch pulse Lp2 (which have mutually different phases) to the latch circuits 20-1 and 20- is started from time T2- and time T2-2, respectively. Next, in step S4, the laser-modulating signal output from the modulating signal generator 24 is forcibly turned on, as is indicated in FIG. 3F, and the low-level driving signal is applied to transistor 36, thereby turning off this transistor 36.

Next, in step S5, the laser-driving current is increased with a predetermined increment from time T1. The increased laser-driving current is output from the input-/output register 38 and is latched in latch circuit 20-2 in synchronism with the output latch pulse LAP2 shown in FIG. 3I. Then, the laser-driving current is supplied to the D/A converter 35, for D/A conversion, whereby the laser-driving current is converted into a voltage signal ADS (FIG. 3M). This voltage signal ADS is applied to transistor 33, so that the current supply to the laser diode 11 is started. In short, the increased laser-driving current is latched in the second latch circuit 20-2 in synchronism with the generation of the output latch pulse LAP2 at time T2-1 in step S6, and the laser diode 11 is driven by the current corresponding to the latched current.

At time T2-2, which is a time delayed by a predetermined length of time in step S7, the generation of the input latch pulse LAP1 is started in step S8. In synchronism with the input latch pulse Lp1 from the selector 45-1, the comparison signal output from the comparator 43 is latched in the latch circuit 20-1. Next, in step S9, the CPU 50 determines whether or not the laser beam emitted from the semiconductor laser 11 has attained the target beam intensity, on the basis of the comparison signal latched in the latch circuit 20-1. The attainment of the target beam intensity means that the output voltage of the comparator 43 has reached the same level as the reference voltage Vref2 of the comparator 43. Accordingly, the output of the comparator 43 is changed from "1" to "0".

If it is determined in step S9 that the laser beam has not yet attained the target beam intensity, then the flow returns to step S5, and steps S5-S9 are repeated until the target beam intensity is attained. If it is determined in step S9 that the target beam intensity has been attained, then the flow advances to step S10. In this step S10, the value of the laser-driving current is stored in RAM 54. Next, in step S11, the laser-modulating signal LMS is forcibly turned off, so that the laser-modulating signal is maintained at a high level from time T3 in the manner shown in FIG. 3F and the output of the D/A converter 35 drops in level at time T3 in the manner shown in FIG. 3M.

In step S12, a check is made to see whether the fixing heater is ready or not. This check is repeated until the fixing heater becomes ready, i.e., until the warming-up operation is completed. When the fixing heater becomes ready and the warming-up operation completed at time T4, as is indicated in FIG. 3B, the CPU 50 waits, in step S13, for a print command to be externally entered from an external unit, for example from a host computer (not shown). When the CPU 50 receives the print command via an input device 30 at time T5, as is indicated in FIG. 3C, the mirror motor is turned on at time T5 (FIG. 3D) in step S14, and the value of the laser-driving signal (which value is stored in step S10) is read out of the RAM 54 in step S15. Next, in step S16, a laser-driving current whose value is 1/n of that of the readout laser-driving current is output from the input/output register 38 under the control of the CPU 50. In step S17, the laser-modulating signal is forcibly turned on at time T6 (FIG. 3F) and is maintained at a low level. In step S18, the laser-driving current is increased with an predetermined increment and in step 19, the output latch pulse LAP2 is generated so that the laser driving current is output from the D/A converter 35 at time T6 as shown in FIG. 3M.

In step 18, the CPU 50 determines whether beam-detection-ready signal BRS from the modulating signal generator 24 is ready or not, when a predetermined length of time has elapsed from time T6. The state where the beam-detection-ready signal is ready is a state where the beam intensity of the scanning beam incident on the beam detector 46 exceeds the level of the reference voltage Vref1 of the comparator 48. If it is determined in step S21 that the beam detection is not ready, then the flow returns to step S18, and steps S18-21 are repeated until the beam-detection-ready signal becomes ready. That is, the current for driving the semiconductor laser 11 is gradually increased so that the beam intensity of the laser beam emitted from the semiconductor laser is gradually increased.

When it is determined in step S21 that the beam-detection-ready signal is ready, step S22 is executed, wherein the laser-modulating signal is forcibly turned off at time T7, as is indicated in FIG. 3F. The modulating signal generator 24 outputs a beam-detection-ready signal. Further, the input/output register 38 outputs a latch pulse-switching signal LXP at time T7, as is indicated in FIG. 3H. In step S23, therefore, the selectors 45-1 and 45-2 select input and output latch pulses LBP1 and LBP2, instead of input and output latch pulses LAP1 and LAP2. When a predetermined length of time has elapsed from time T7 (i.e. from the generation of the beam detection signal), the laser beam is directed to the region outside of the photosensitive drum 10. At the time (i.e., at time T8), the level of the modulation signal generated by the modulating signal generator 24 is changed from high to low. Accordingly, the semiconductor laser emits a laser beam, for sampling. As is indicated in FIG. 3L, therefore, the latch pulse Lp1 (FIG. 3I) corresponding to input latch pulse LBP1 is supplied from the selector 45-1 to the latch circuit 20-1.

After interruption is allowed in step S24, a check is made in step S25 to see whether or not the input latch pulse LBP2 which the CPU 50 receives is an interruption signal IS. This check is repeated until the CPU 50 identifies the interruption signal IS. When the CPU 50 identifies the interruption signal IS, the comparison signal output from the comparator 43 is latched in the latch circuit 20-1 by the input latch pulse Lp1 shown in FIG. 3L. Next, in step S26, the CPU 50 determines whether or not the laser beam has attained the target beam intensity, on the basis of the comparison signal latched in the latch circuit 20-1. If the target beam intensity has not yet been attained, the laser-driving current is increased with a predetermined increment in step S27, and the increased laser-driving current is latched in the latch circuit 22-2 in response to the output latch pulse LBP2, which has a phase different from that of the input latch pulse LBP1. The driving current signal latched in the latch circuit 22-2 is supplied to the D/A converter 35. Accordingly, the voltage output from the D/A converter 35 is increased, as is indicated in FIG. 3M. Thereafter, the flow returns to step S25, and the above operation is repeated until the target beam intensity is attained. When the target beam intensity is attained, the laser-driving current is decreased with a predetermined decrement in step S28, so that the voltage output from the D/A converter 35 drops, as is indicated in FIG. 3M. Thereafter, the flow returns to step S25. That is, at time T9, the voltage output from the D/A converter 35 is increased, the beam-detection signal BTP is generated from the comparator 48, and the semiconductor laser 11 is de-energized, with the level of the laser-modulating signal LMS being changed from low to high. At time T10, the laser 11 is energized again, and the comparison signal pertaining to a monitoring beam is latched. If the target beam intensity has not yet been attained, the voltage output from the D/A converter 35 is increased at time T11. If the target beam intensity has been attained, the voltage output from the D/A converter 35 is decreased at time T12. In this manner, the voltage output from the D/A converter is repeatedly increased or decreased. That is, after the target beam intensity is attained, the beam intensity of the semiconductor laser unit 11 is controlled each time an interruption signal is received by the CPU 50.

FIGS. 4A-4E are enlarged timing charts, of which FIG. 4A corresponds to FIG. 3E and shows a beam-detecting signal produced after the attainment of the target beam intensity, FIG. 4B corresponds to FIG. 3F and shows a modulation signal, FIGS. 4C and 4D correspond to FIGS. 3L and 3K and show input and output latch pulses LB1 and LB2, respectively, and FIG. 4E corresponds to FIG. 3M and shows a voltage signal produced from the D/A converter 35. As is indicated in FIG. 4A, the laser beam scans one line during period TL, in which a beam-detecting signal is detected. As is indicated in FIG. 4B, the modulation signal is modulated with externally-supplied image information in period TI, to thereby record an image on the photosensitive drum 10.

As mentioned above, the latch signal generator generates a first latch signal in a region other than the recording region, on the basis of the beam-detecting signal, and the comparison signal output from the comparator is latched in the first latch circuit by use of the first latch signal. The beam intensity of the semiconductor laser unit is controlled by setting the driving current to the semiconductor laser unit in accordance with the latched comparison signal and by latching this driving signal in the second latch circuit in response to the second latch signal having a different phase from that of the first latch signal. Accordingly, the semiconductor laser unit does not emit a laser beam in the interval in which image formation is not performed, i.e., in the interval between the image-forming operation performed for one page and the image-forming operation performed for the next page Therefore, toner is prevented from being wasted, particularly in the case where a reversal development system is used. Further, the subject control system can be low in price since it eliminates the need to use a high-speed A/D converter.

The comparison result can be reliably read even if the time period in which the semiconductor laser unit emits a laser beam toward a region other than the recording region is short. In addition, since the value of a driving current is determined between the generation of a given latch signal and the generation of the subsequent latch signal, the microcomputer is allowed to have ample time for determining the value of the driving current. This being so, the subject system can be low in price since it can employ a general-purpose microcomputer. In addition, the subject system is applicable even to a high-speed printer.

Even in the arrangement wherein the beam intensity detector which detects the beam intensity of the semiconductor laser unit is located away from the beam intensity controller of the semiconductor laser unit, the comparator circuit can be arranged in the vicinity of the beam intensity detector. Therefore, the operation of the subject system is hardly affected by noise.

In the embodiment mentioned above, a comparison signal is latched each time one line is scanned with the laser beam, and the beam intensity of the semiconductor laser unit is controlled in accordance with the latched comparison signal. However, this in no way limits the present invention. For example, a comparison signal may be latched each time a certain number of lines are scanned, and the beam intensity of the semiconductor laser unit may be controlled in accordance with such a latched comparison signal.

In the embodiment mentioned above, the input and output latch pulses LBP1 and LBP2 are alternately generated by the modulating signal generator 24 in synchronized with the beam detection signal BTP in the two scanning line period in which two scanning lines are scanned with the laser beam, as is indicated in FIGS. 3L and 3K. However, the present invention is in no way limited to this. For example, the input and output latch pulses LBP1 and LBP2 having different phases may be alternately generated in synchronism with the beam detection signal BTP in the one scanning line period in which the one scanning line is scanned with the laser beam, as is indicated in FIGS. 3N, 3O, 4F and 4G. In this case, a reference signal AMS and a driving signal DDS are alternately latched in the first and second latch circuits 20-1 and 20-2 in the one scanning line period, so that the driving current having a waveform shown in FIGS. 3P and 4H is output from the D/A converter 35.

As detailed above, the beam intensity control apparatus of the present invention can reliably control the intensity of a laser beam emitted from the semiconductor laser unit without wasting toner. In addition, it eliminates the need to employ a high-speed A/D converter or a high-speed microcomputer even if it is applied to a high-speed laser printer or a high-speed digital copying machine. Further, it prevents inclusion of noise even if the beam intensity-detecting means and the beam intensity controller are located away from each other.

Additional advantages and modifications will readily occur to those skilled in the art. Therefore, the invention in its broader aspects is not limited to the specific details, and illustrated examples shown and described herein. Accordingly, various modifications may be without departing from the spirit or scope of the general inventive concept as defined by the appended claims and their equivalents.

What is claimed is:

1. An apparatus for adjusting the intensity of a light beam, comprising:
   means for generating the light beam;
   first means for detecting the intensity of the light beam generated from the generating means;
   means for comparing the intensity of light beam detected by the detecting means with a predetermined reference value and outputting a comparison result;
   first storing means for storing the comparison result at a first predetermined interval;
   means for determining a driving signal for driving the light-beam generating means, in accordance with the comparison result stored in the first storing means;
   second storing means for storing the driving signal at a second interval; and
   means for driving the light beam-generating means in accordance with the driving signal stored in the second storing means, so as to adjust the intensity of the light beam generated from the light beam-generating means.

2. An apparatus according to claim 1, further comprising:

means for deflecting the light beam generated by the generating means and detected by the first detecting means; and second means for detecting the deflected light beam to generate a detection signal.

3. An apparatus according to claim 2, further comprising:

a photosensitive image carrier;

means for scanning the image carrier with the deflected light beam to form a latent image thereon.

4. An apparatus according to claim 3, wherein said first storing means includes:

means for outputting a first latch signal;

means for storing the comparison result in response to the first latch signal.

5. An apparatus according to claim 4, wherein said second storing means includes:

means for outputting a second latch signal; and means for storing the driving signal in response to the second latch signal.

6. An apparatus according to claim 5, wherein the second detecting means generates the detection signal in a predetermined cycle and the first and second latch signals are generated in a cycle the same as that of the detection signal and at different phases from each other.

7. An apparatus according to claim 5, wherein each of the first and second latch signals has a cycle half that of the detection signal and the first and second latch signals are alternately generated.

8. An apparatus according to claim 1, wherein said determining means includes means for increasing or decreasing the intensity of the light beam cyclically and gradually in accordance with the comparison result.

9. An apparatus according to claim 1, wherein said determining means includes mean for generating the driving signal in accordance with the comparison result on the basis of a predetermined program and supplying the driving data to the second storing means.

10. An apparatus according to claim 9, further comprising:

means for supplying a program-execution signal to the driving means in accordance with the detection signal.

* * * * *